United States Patent [19]

Walther

[11] Patent Number: 4,565,288
[45] Date of Patent: Jan. 21, 1986

[54] TUBULAR CONTAINER FOR THE ACCEPTANCE OF SEMICONDUCTOR COMPONENTS

[75] Inventor: Albert Walther, Holzkirchen, Fed. Rep. of Germany

[73] Assignee: Siemens Aktiengesellschaft, Berlin & Munich, Fed. Rep. of Germany

[21] Appl. No.: 625,540

[22] Filed: Jun. 28, 1984

[30] Foreign Application Priority Data

Jun. 30, 1983 [DE] Fed. Rep. of Germany ....... 3323589
Feb. 8, 1984 [DE] Fed. Rep. of Germany ....... 3404467

[51] Int. Cl.$^4$ ...................... B65D 85/42; B65D 65/18
[52] U.S. Cl. .................................. 206/328; 206/334; 206/331; 361/220
[58] Field of Search ...................... 206/328, 331, 334; 361/220

[56] References Cited

U.S. PATENT DOCUMENTS 4,037,267 7/1977 Kisor .................................. 206/331
4,327,832 5/1982 deMatteo ............................ 206/334
4,353,481 10/1982 Tando .................................. 206/328

FOREIGN PATENT DOCUMENTS 3230075 2/1984 Fed. Rep. of Germany ...... 206/328

Primary Examiner—J. E. Kittle
Assistant Examiner—James J. Seidleck
Attorney, Agent, or Firm—Hill, Van Santen, Steadman & Simpson

[57] ABSTRACT

A tubular container or magazine having at least one external wall forming a hollow interior cavity for loosely receiving and holding components characterized by an arrangement of either glide edges, glide surfaces or guide ridges which engage a housing of the component to limit or prevent frictional engagement of surfaces of the housing of the component with an interior surface of the cavity to greatly reduce tribo-electrical charging. If the component has terminals and particularly if these terminals are bent and extend from opposite surfaces to give a U-shaped profile, the glide surfaces, glide edges or ribs can coact to prevent the terminals from engaging or contacting the internal surface of the container's cavity. In one embodiment, a U-shaped component is provided and a portion of the container wall that extends between the terminals of the component is an electrically conductive charge collector which acts to limit or prevent damage to the component due to either static electricity charging and discharging.

11 Claims, 6 Drawing Figures

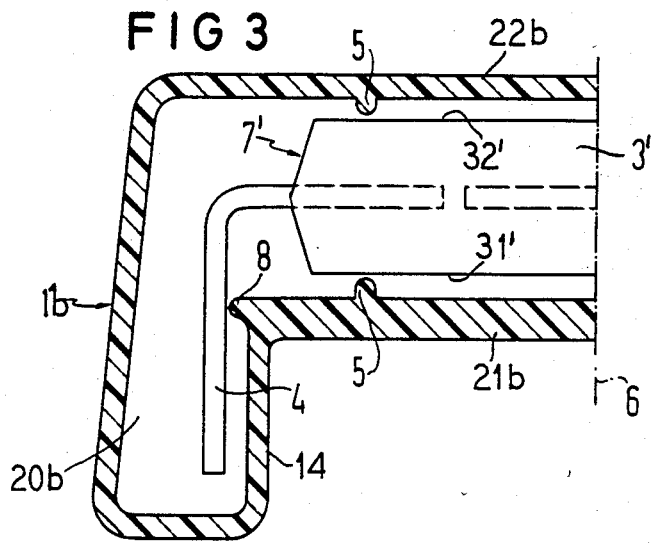
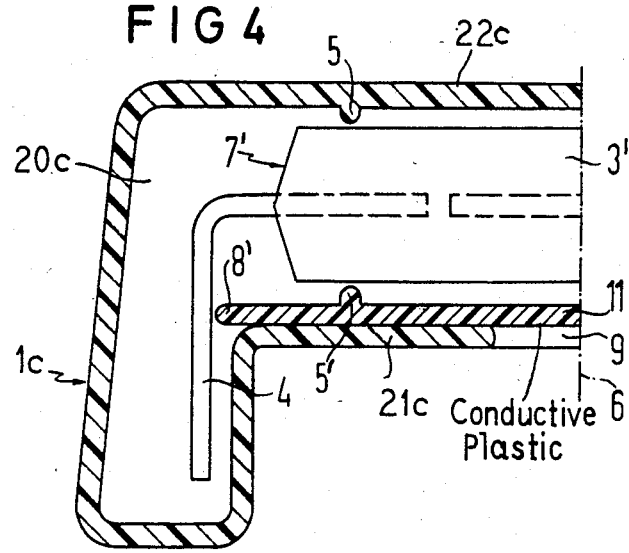

TUBULAR CONTAINER FOR THE ACCEPTANCE OF SEMICONDUCTOR COMPONENTS

BACKGROUND OF THE INVENTION

The present invention is directed to a tubular container having at least one exterior wall forming a hollow interior cavity for loosely receiving and holding components such as semiconductor components with an arrangement to protect the component against electrostatic charging and/or discharging by providing an arrangement in the interior of the cavity which spaces the component from the interior surfaces of the cavity to limit frictional engagement.

As known, electrostatic charging or respectively discharging is frequently the cause of damage to or the destruction of semiconductor components. The container having hollow section are therefore employed for transporting and storage of electrostatically endangered components. The components are inserted into the container and are successively lined up in the container which consist of an electrically conductive material or a material that has been anti-statically treated in order to prevent charging.

One of the known protective measures consists of creating an anti-static container surface by means of treatment with an anti-static agent or fluid. Over the course of time, however, the coating of the anti-static agent or fluid can lose its protective effect due to abrasion or evaporation. Furthermore, these types of arrangements have an undesirable dependency on the ambient atmospheric humidity. The slackening of the protection which is provided, however, cannot be optically perceived so that a simple monitoring of the container and components is not possible. In addition, the halogens, nitrates and sulfates often contained in the anti-static agent or fluid will promote corrosion of the metallic terminal of the modules or component which corrosion is an undesirable condition.

One improved method that has already been suggested is to make all the container walls conductive by means of a mixture of the synthetic material containing lampblack or carbon. Since such a material has a very low resistance, the semiconductor module within them can also be damaged by an external discharge through the container wall. The addition of carbon also blackens the material of the container and thus makes visual inspection of the container or magazine impossible. Another undesirable property of the addition of the carbon to the synthetic material is the reduction of the mechanical stability of the synthetic material.

A bar magazine for the acceptance of a stack of logic elements or components is known and disclosed in U.S. Pat. No. 4,353,481. The logic elements or components are given a low friction guidance with a reduced tribo-electrical charging because at least one inside wall of the magazine or container has a web with a triangular cross-section which web extends continuously along the longitudinal direction of the container. A multitude of such webs however is required in order to prevent all large surface frictional contact between the components or modules and the container walls particularly given the so-called dual-in-line housing. Particular attention must also be given to the terminal legs or pins of the components so that they remain out of contact with the container wall as much as possible. Regarding the manufacture of the magazine however, it is desirable to have a container that requires the fewest additional shapings of the structure of the container.

SUMMARY OF THE INVENTION

The object of the present invention is to improve the protective effect of the container which loosely receives and stores components.

To accomplish these objects, the present invention is directed to a tubular container having at least one exterior wall forming a hollow interior cavity for loosely receiving and holding components which include a housing having housing surfaces forming edges extending in a longitudinal direction of the cavity. The hollow interior is similar to the profile of the component and if the component has terminals on opposite edges which are bent to give it a U-shaped profile, the external wall will form a hollow interior cavity with a U-shaped cross-section. The container will have means for protecting the component received in the interior against both electrostatic charging and discharging and this means includes means for preventing frictional engagement of the housing surface of the component and a wall surface of the cavity and this means for preventing engages the housing and possibly also the terminals of the component to prevent the housing surface from engaging the wall surface of the container. The means for preventing can be a plurality of glide surfaces which extend in the longitudinal direction and are inclined relative to the housing surface adjacent the nearest edge of the component and engage the edge. In another embodiment, the means for preventing can be a plurality of longitudinal ribs which are arranged to space the component away from the interior wall surfaces of the container and coact with other ribs to maintain the terminals, if present, from engaging wall surfaces of the cavity. In another embodiment, the means for preventing comprises a rail or projection which extends into the interior of the cavity and provides guide or glide edges which engage either the housing of the component or the terminals to maintain the component in the terminals away from the interior wall surface of the container.

The advantage of the means for preventing which guide the component and restrict contact with the interior surfaces of the container to a minimum is achieved without needing to form a multitude of individual guide or glide webs. The inventive container keeps inadmissibly high external discharge currents which are caused, for example, by electrostatically charged persons away from the module. It also largely prevents a tribo-electrical charging and does not restrict the material selection in view of the optical inspection of the magazine content. Disruption-free equipping and emptying in automatic assembly apparatuses is guaranteed because of the good sliding characteristics of the container.

The container also achieves the object of the invention when the container material has a specific ohmic resistance of $10^5$ through $10^{10}$ ohm cm. The object is also achieved in that the parallel glide rails which are part of the means for preventing frictional engagement between the surface of the container and the components are formed at the inside of the container. A further solution consists of constructing the container wall at least in part of at least two abrasion-proof layers having different specific ohmic resistance. Given a container having a U-shaped hollow cross-section, the object is achieved in that the wall section that extends between the internally disposed legs will comprise an electrically conductive charge collector at least at the inside of the container. This collector has the advantage that a greater potential difference is avoided by means of a constant charge equalization between the terminals of the component. Thus, an endangerment of the component due to a discharge outside of the container is greatly reduced due to the disposition and the shaping of the discharge path.

To assure a symmetrical and therefore a module preserving charge equalization particularly when the container serves as a dispenser for dispensing the components to machines for further processing such as for an automatic assembly machine, the container wall contains a longitudinally extending aperture or recess which enables maintaining a contact with the charge collector. In one embodiment, the charge collector is mounted to engage the edges of the recess or aperture with a portion being disposed outside of the cavity.

BRIEF DESCRIPTION OF THE DRAWINGS

FIG. 3 is a partial transverse cross-sectional view of an embodiment of the container of the present invention;

FIG. 4 is a partial transverse cross-sectional view of another embodiment of the container of the present invention.

DESCRIPTION OF THE PREFERRED EMBODIMENTS

Figure 1:
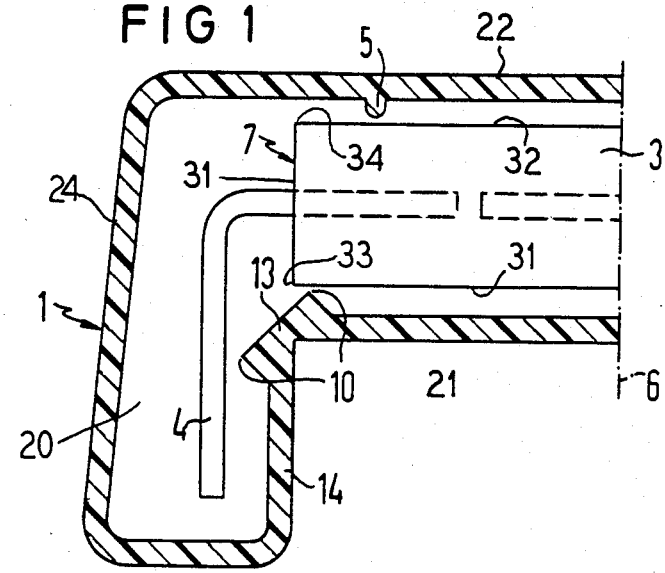
FIG. 1 is a partial transverse cross-sectional view of a container in accordance with the present invention.

The principles of the present invention are particularly useful when incorporated in a hollow tubular container generally indicated at 1 in FIG. 1. The container 1 has an interior cavity 20 which loosely receives a component generally indicated at 7. As illustrated, one-half of the transverse cross-section of the container is shown in the Figure with a center line 6 of the container and the other half (not illustrated) is a mirror image of the half shown.

The component 7 can be a semiconductor component having a plastic housing 3 which may contain a semiconductor element and is provided with terminals 4 which extend out of an end surface 30 of the housing and are bent at right angles so that the component has a U-shaped profile. The housing 3 preferably has a cuboid shape with housing surfaces such as 31 and 32 which coact with the end surface 30 to form edges 33 and 34 which extend along the longitudinal dimension or direction of the container 1. The type of housing illustrated with the terminals 4 is often referred to as a dual-in-line housing and is pluggable into a circuit board.

In order for the interior cavity 20 to have a U-shaped configuration or cross-section, the container 1 has outer walls 21 and 22 which extend substantially parallel to each other with the wall 21 merging with a leg portion 14 that extends to an end wall 23 which is connected to the wall portion 22 by an outer leg portion 24. The spacing of the various leg portions 14 and 24 as well as the spacing of the bight portion such as 21 and wall portion 22 are such that the component 7 is loosely received in the cavity 20.

To provide means for preventing surface engagement between housing surfaces such as 31 and 32 with the inner surfaces of the walls 21 and 22 forming the cavity, the container has a rail 13 at the corner formed by the inner leg 14 and the bight portion 21. The rail 13 provides two guide or glide edges 10 with one being directed towards the housing surface 31 of the housing 3 of the component and the other being directed toward the terminal 4. Considering that the opposite half of the container is a mirror image of the illustrated half, then the housing surface 31 will slide along a pair of the spaced edges 10 to prevent the surface 31 from engaging an inner surface of the cavity 20 with a planar frictional contact. In addition, the terminal legs 4 are prevented from engaging the surfaces of the inner leg portions 14 due to the glide edge 10. In addition, the wall 22 has a pair of guide or glide webs, ribs or ridges 5 that prevent the housing surface 32 from coming into frictional contact with the surface of the wall portion 22.

Figure 2:
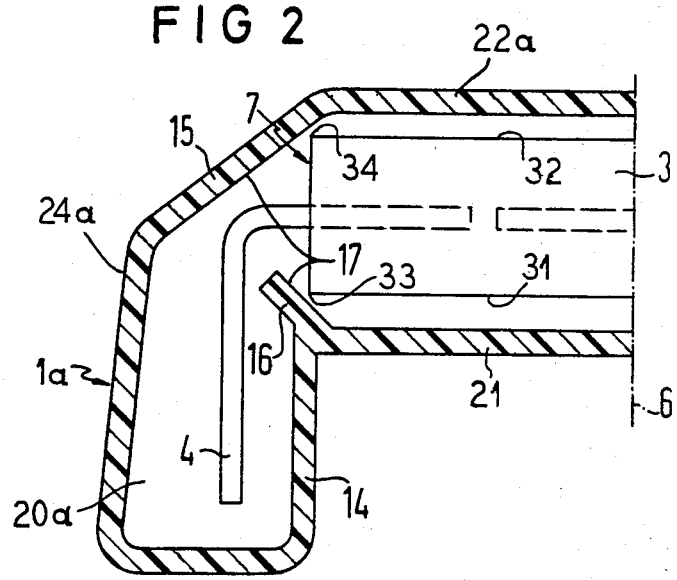
FIG. 2 is a partial transverse cross-sectional view of an embodiment of the container in accordance with the present invention.

An embodiment of the invention is illustrated by the container which is generally indicated at 1a in FIG. 2. The container 1a has an interior cavity 20a for receiving the components 7 which cavity is provided with glide surfaces such as 17. Due to the position of the glide surfaces 17 and their coaction with edges such as 33 and 34 of the housing 3 of the component, it prevents the housing surfaces such as 31 and 32 from coming into planar contact with the interior wall of the container. The glide surfaces 17 extend in a longitudinal direction and are inclined relative to the housing surfaces such as 31 and 32. As illustrated, one of the glide surfaces 17 is formed by a wall portion 15 which extends between wall portions 22a and 24a at an angle of approximately 45° to the wall portion 22a. In other words, the wall portion 15 cuts off the corner that existed in the housing 1 between the two wall portions 22 and 24. The other glide surfaces 17 is formed by a guide rail or projection 16 which extends inward from the corner formed by the wall 14 and the bight portion 21. The free end of the guide rail 16 acts to prevent the terminals 4 from contacting the inner surface of the legs such as 14.

In the embodiment 1a of FIG. 2, the glide surfaces or faces 17 are planar. These glide surfaces 17 act in diagonal pairs with the surface or face formed by the wall portion 15 coacting with the diagonally opposite surface 17 formed by the rail or projection 16.

Figure 2A:
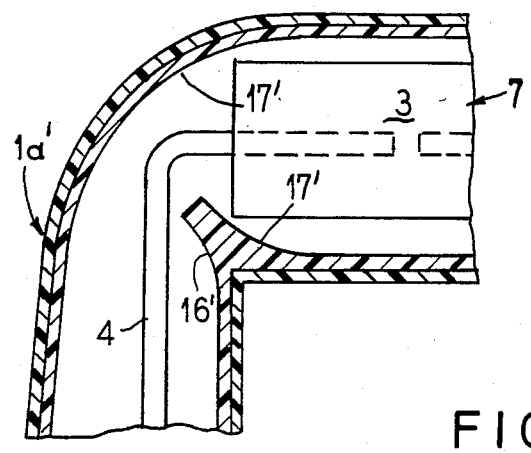
FIG. 2a is a partial transverse cross-section illustrating a modification of the embodiment of FIG. 2.

A modification of the container is generally indicated at 1a' in FIG. 2a. In this modification, the glide faces 17' are concavely curved which results in that the angle of inclination of the face 17' to the housing surfaces such as 31 does not remain constant and is defined by a tangent to the radius of the curvature. The curve of the arch or surface 17' is selected so that the play for tilting motion on the part of the component 7 relative to the container 1a' becomes as little as possible.

Another embodiment of the container is generally indicated at 1b in FIG. 3. As illustrated, this container receives components which are generally indicated at 7' and are substantially the same as the component 7 except that the end of the housing 3' does not form a square corner with the housing surfaces 31' and 32'. In this embodiment, the walls such as 22, 24 and 14 are the same shape and construction as in the embodiment of FIG. 1. However, the bight portion formed by a wall 21b between the two inner leg portions 14 is substantially thicker than the remaining wall portions. In this embodiment, the means for preventing frictional engagement of the housing surfaces with the inner surface of the container include parallelly extending spaced first glide webs or ribs 5 which are provided on the inner wall 21b and the opposite outer wall 22b. The coaction of these ribs prevents housing surfaces such as 31' and 32' of the housing 3' of the component 7' from coming into frictional contact with the inner surfaces of the wall such as 21b and 22b. Thus, large surfaced tribo-electrical charging will not occur. In addition, a second glide rail or rib 8 extends from the corner of the bight portion 21b and the leg portions 14 and prevent the terminals or connections 4 of the component 7' from engaging the inner surface of the inner leg such as 14. These second glide ribs or webs 8 also will act to restrict lateral motion of the module or component 7' when disposed in the container 1b.

Another embodiment of the container is generally at 1c in FIG. 4. The container 1c includes a high-resistant charge collector 11 which is mounted on an inner surface of the wall portion 21c so that the collector 11 extends between the external terminals 4. The wall portion 21c is a bight portion. The specific resistance of the charge collector 11 preferably lies in the range of $10^2$ through $10^7$ ohms centimeter. The walls of the container 1 preferably consist of a transparent material.

A pair of first guide webs or ribs 5, which extend along the longitudinal length of the container 1, are formed on the charge collector 11. Opposite the ribs 5', ribs 5 are provided on the opposite container wall 22c. As described with regard to FIG. 1, the guide ribs form the means to prevent frictional engagement and thus minimize the tribo-electrical friction surface between the housing 3' of the component and the charge collector 11. Furthermore, the charge collector is constructed to extend laterally beyond the edge of the wall portion 21c with the edges of the charge collector forming the second guide webs or ribs 8' which space the terminals 4 from the inner surfaces. In addition, these guide ribs or webs 8' act as contacts between the terminals 4 and the charge collector 11.

Along the center line 6, the wall section 21' is provided with an elongated recess or aperture 9. Thus, electrical contact of the charge collector 11 can be obtained from the outside by a contact springs extending through the aperture 9. Therefore, a preservation charge dissipation can be executed in this fashion.

Figure 5:
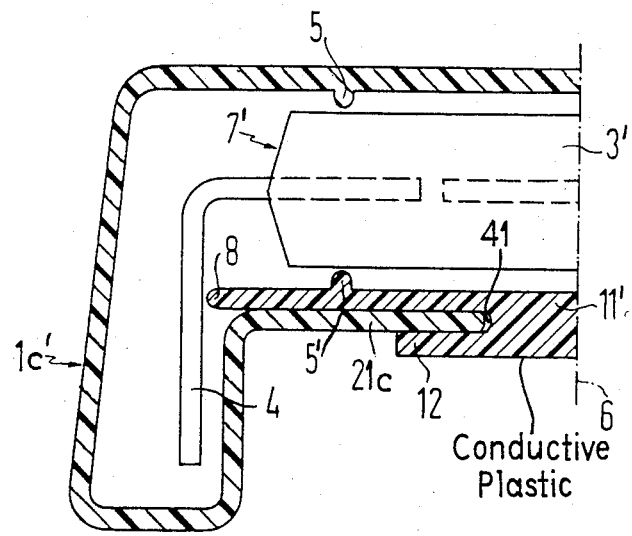
FIG. 5 is a partial transverse cross-sectional view of a modification of the embodiment of the container of FIG. 4.

A modification of the embodiment of FIG. 4 is illustrated in FIG. 5 by the container generally indicated at 1c'. In this embodiment, a charge collector 11' has an H-shaped cross-section with laterally extending portions 12 coacting with the remaining portion to form longitudinally extending grooves 41 for receiving the edge of the wall section 21c which edge forms the aperture 9. As illustrated, electrical contact for a potential equalization with a machine or tool or the like can be produced by spring contacts which engage this exposed portion of the charge collector 11' which extends along the outer surface of the container 1c'.

In each of the embodiments, the walls such as 21, 22, 23, 24 and 14 can be constructed of two abrasion-proof layers having different specific ohmic resistances as illustrated in FIG. 2a. For example, the first layer may have a specific ohmic resistance of $10^5$ ohms cm and the second layer which is disposed on the inside of the container adjacent the cavity such as 20 will have a surface resistance of $10^2$–$10^{11}$ ohms per cm$^2$ square.

Although various minor modifications may be suggested by those versed in the art, it should be understood that I wish to embody within the scope of the patent granted hereon, all such modifications as reasonably and properly come within the scope of my contribution to the art.

I claim:

1. A tubular container having at least one external wall with a pair of inner leg portions extending from a bight portion to form a hollow cavity with a U-shaped cross-section for loosely receiving and storing at least one component which has a housing with housing surfaces forming housing edges extending in the longitudinal direction of the container, said component being a dual-in-line component with terminals extending outward from the opposite end surfaces and being bent to provide a U-shaped configuration similar to the cross-section of the container, said container having means for protecting the component contained therein from electrostatic charging and discharging, said means including means to prevent frictional engagement of the housing surfaces on an interior wall surface of the bight portion, said means for preventing including a longitudinally extending rail adjacent each corner of the bight portion and an inner leg portion, said rail extending into the cavity and having a glide edge facing the terminals to keep them from engaging the inner leg portion and a glide edge facing the housing of the component to prevent frictional engagement of the surface of the bight portion with the housing surface.

2. A hollow container having anticharging and antidischarging properties comprising an exterior wall forming a cavity having a U-shaped transverse cross-section for receiving components which have a housing and two rows of external contacts to form a U-shaped profile, said container having means to prevent frictional engagement between the surfaces of the housing of the component and the inner surfaces of the cavity, said means including longitudinally extending rib portions on the inner surface of the wall portion of the cavity including first glide ribs being formed in pairs on the wall portions extending between the U-shaped leg portions of the container and second glide ribs being disposed on the inner legs for spacing the contacts away from the inner surface of the inner leg portions of the container.

3. A tubular container for receiving and holding components, which have housing surfaces forming edges extending in a longitudinal direction of the container, each component having terminals extending outwardly from opposite end surfaces of the housing of the component with the terminal being bent to give the component a U-shaped profile, said container having at least one exterior wall with a bight portion extending between a pair of inner leg portions to form a hollow cavity with a U-shaped cross-section for receiving said components, said container having means for protecting components received in the cavity against both electrostatic charging and discharging, said means including means for preventing frictional engagement of a housing surface of the component and an interior wall surface of the cavity comprising at least one glide surface extending in the longitudinal direction of the container and being inclined relative to the housing surfaces adjacent the nearest edge of the component, said glide surface being engageable with the nearest edge to hold the housing surface off of the interior wall surface of the cavity, and at least one glide surface on each side of the cavity being formed by a longitudinally extending projection at the junction of the bight portion and the inner leg portion, said projection having a free end for maintaining the terminal of the component from engaging an inner surface of the inner leg portion.

4. A tubular container according to claim 3, wherein the component has a housing with a cuboid shape and the container has four glide surface.

5. A tubular container according to claim 4, wherein each of the glide surfaces is a planar surface and said glide surfaces being arranged in diagonally extending pairs.

6. A tubular container according to claim 4, wherein each of the glide surfaces is a concavely curved surface.

7. A tubular container according to claim 4, wherein at least one of the glide surfaces is formed by a corresponding wall portion of the tubular container.

8. A tubular container having anticharging and antidischarging properties and being designed for receiving components having a housing with two rows of external terminals extending from opposite ends with the terminals being bent so that the components have a U-shaped cross-section, said container having an exterior wall forming a cavity having a U-shaped transverse cross-section with a bight portion extending between a pair of inner leg portions, and an electrically conductive charge collector being disposed on the bight portion of the container to extend between the terminals of a component stored therein, said charge collector having longitudinally extending ribs for holding the component from frictional surface engagement therewith and said charge collector having edge portions extending beyond the inner leg portions to act as spacers to prevent engagement of the terminals of the component with an inner surface of the leg portions of the container.

9. A container according to claim 8, wherein the wall portions of the container consist of transparent material.

10. A container according to claim 8, wherein the bight portion of the container wall has a longitudinally extending aperture exposing a portion of the charge collector to the exterior to enable forming an electrical contact therewith.

11. A container according to claim 10, wherein the charge collector has an H-shaped cross-section with oppositely opening grooves for engaging the edges of the aperture so that a portion of the charge collector is mounted on an outside surface of the container wall.

* * * * *